United States Patent
Tomita et al.

(10) Patent No.: US 6,714,478 B2
(45) Date of Patent: Mar. 30, 2004

(54) SEMICONDUCTOR MEMORY DEVICE HAVING DIVIDED WORD LINE STRUCTURE

(75) Inventors: Hidemoto Tomita, Hyogo (JP); Motomu Ukita, Hyogo (JP); Shigeki Ohbayashi, Hyogo (JP); Yoji Kashihara, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 34 days.

(21) Appl. No.: 10/212,816

(22) Filed: Aug. 7, 2002

(65) Prior Publication Data

US 2003/0156485 A1 Aug. 21, 2003

(30) Foreign Application Priority Data

Feb. 21, 2002 (JP) .......................................... 2002-044966

(51) Int. Cl.$^7$ .................................................. G11C 8/00
(52) U.S. Cl. .............. 365/230.06; 365/154; 365/730.03
(58) Field of Search ........................ 365/230.06, 230.03, 365/154

(56) References Cited

U.S. PATENT DOCUMENTS 6,088,286 A * 7/2000 Yamauchi et al. ..... 365/230.06
6,418,075 B2 * 7/2002 Shimano et al. ............ 365/227
6,424,589 B2 * 7/2002 Mochida ................. 365/230.06

FOREIGN PATENT DOCUMENTS

| JP | 59-72695 | 4/1984 |
| JP | 4-143995 | 5/1992 |
| JP | 7-282598 | 10/1995 |

OTHER PUBLICATIONS

S. Aizaki, et al., "A 15ns 4Mb CMOS SRAM", ISSCC Digest Technical Papers, Feb. 1990, pp. 126–127, 280.

* cited by examiner

Primary Examiner—Hoai Ho
(74) Attorney, Agent, or Firm—Burns, Doane, Swecker & Mathis, L.L.P.

(57) ABSTRACT

A local decoder controlling activation of each word line includes a first transistor connected between first and second nodes, a second transistor connected between a power-supply voltage and the first node, and an inverter driving a word line with the power-supply voltage or a ground voltage in accordance with the voltage of the first node. When a corresponding word line is activated, the second node is set at the ground voltage while the first transistor is turned on. In a burn-in test, a burn-in control circuit forcibly turns off the second transistor in a local decoder corresponding to a word line to be activated.

7 Claims, 9 Drawing Sheets

SEMICONDUCTOR MEMORY DEVICE HAVING DIVIDED WORD LINE STRUCTURE

BACKGROUND OF THE INVENTION

Field of the Invention

The present invention relates to a semiconductor memory device, and more particularly, to a local decoder in a semiconductor memory device having a divided word line structure, which is used in a Static Random Access Memory (SRAM) and the like.

In a semiconductor memory device such as an SRAM and a Dynamic Random Access Memory (DRAM) having a large-scale memory array, a so-called "divided word line structure" is known that is directed to suppress delay in signal propagation on a word line and to reduce the circuit scale of a decode circuit effecting word line selection. An example of the divided word line structure is disclosed in Japanese Patent Laying-Open No. 59-72695 (hereinafter also referred to as "Conventional Example 1").

FIGS. 5 and 6 are the first and second conceptual diagrams each illustrating a divided word line structure shown in Conventional Example 1.

A semiconductor memory device shown in FIG. 5 includes a memory array divided into four memory blocks 5a to 5d, a global decoder 10, and local decoder zones 20a to 20d provided in correspondence to memory blocks 5a to 5d, respectively. Memory cells MC are arranged in a matrix of rows and columns in each of memory blocks 5a to 5d. A word line WL is arranged in correspondence to each of the memory cell rows, whereas a bit line pair BLP constituted by complementary bit lines BL and /BL is arranged in correspondence to each of the memory cell columns.

A global word line GWL is provided common to memory blocks 5a to 5d along a longitudinal direction (row direction) of a chip. Each word line WL is separately arranged in each of memory blocks 5a to 5d. Global decoder 10 is arranged at a middle portion of the memory array, i.e., between memory blocks 5b and 5c, to control activation of global word line GWL. Local decoder zone 20a arranged at memory block 5a to control activation of word line WL and local decoder zone 20b arranged at memory block 5b to control activation of word line WL are locally arranged at the border of memory blocks 5a and 5b. Likewise, local decoder zone 20c arranged at memory block 5c to control activation of word line WL and local decoder zone 20d arranged at memory block 5d to control activation of word line WL are locally arranged at the border of memory blocks 5c and 5d.

In a semiconductor memory device shown in FIG. 6, global decoder 10 is arranged in correspondence to an end of a memory array constituted by memory blocks 5a to 5d. The other parts are structured as in the semiconductor memory device shown in FIG. 5.

In each of the semiconductor memory devices shown in FIGS. 5 and 6, memory cell MC is provided with a "SRAM cell" represented by e.g. a high resistance load N-MOS (Metal Oxide Semiconductor) memory cell shown in FIG. 7, a TFT (Thin-Film Transistor) load memory cell shown in FIG. 8, and a CMOS (Complementary MOS) memory cell shown in FIG. 9.

Referring to FIG. 7, memory cell MC of a high resistance load N-MOS memory cell includes N-channel MOS transistors 31 and 32 each having a gate connected to a corresponding word line WL, a high resistance loads 34 and 35 connected between a power-supply voltage Vcc and respective nodes Ns and /Ns, and N-channel MOS transistors 36 and 37 connected between respective nodes Ns and /Ns and a ground voltage Vss. Nodes Ns and /Ns are electrically coupled to complimentary bit lines BL and /BL, respectively, via transistors 31 and 32.

Nodes Ns and /Ns are connected to bit lines BL and /BL, respectively, in response to word line WL being activated (to a high level). This allows data on bit lines BL and /BL to be written into respective nodes Ns and /Ns. Once the data is written, it is held by transistors 36 and 37 that are complementarily turned on, and by high resistance loads 34 and 35, during power input.

It is noted that, in the present description, a high-voltage state (high level) and a low-voltage state (low level) of each signal line, signal, data and the like that are set in binary are also simply referred to as "H" level and "L" level, respectively.

Referring to FIG. 8, in a memory cell MC of a TFT load memory cell, TFT loads 41 and 42 formed by P-type thin-film transistors (TFT) are arranged in place of high resistance loads 34 and 35 in the structure of the high resistance load N-MOS memory cell shown in FIG. 7. This prevents through current from flowing between power-supply voltage Vcc and ground voltage Vss via nodes Ns or /Ns, reducing power consumption at the memory cell.

Referring to FIG. 9, in a memory cell MC of a CMOS memory cell, P-channel MOS transistors 45 and 47 are provided in place of high resistance loads 34 and 35, respectively, in the structure of high resistance load N-MOS memory cell shown in FIG. 7. The CMOS memory cell is known as having a highly stable structure with a large operation margin.

FIG. 10 is a circuit diagram illustrating a structure of a local decoder zone in the divided word line structure. In FIG. 10, local decoder zones 20a and 20b of local decoder zones 20a to 20d shown in FIGS. 5 and 6 are representatively illustrated.

Referring to FIG. 10, it is assumed that four word lines WL, associated with one global word line GWL, are arranged in each of memory blocks 5a to 5d.

Local decoder control circuit 15 generates a word line selection signal that is associated with each one of the four word lines associated with one global word line GWL. The word line selection signal is independently generated at each of memory blocks 5a to 5d, to control selection from each set of four word lines associated with one global word line GWL. Local decoder control circuit 15 generates word line selection signals WSa0 to WSa3 to be associated with memory block 5a, and word line selection signals WSb0 to WSb3 to be associated with memory block 5b.

Local decoder control circuit 15 selectively activates one of the four word line selection signals associated with a selected memory block, and inactivates the remaining word line selection signals. In addition, word line selection signals associated with a non-selected memory block are inactivated. For instance, when memory block 5a is selected, one of word line selection signals WSa0 to WSa3 is selectively activated, while the remaining word line selection signals are inactivated.

Though not shown, word line selection signals are generated similarly for each of memory blocks 5c and 5d. In the description below, word line selection signals WSa0 to WSa3, WSb0 to WSb3, . . . are also simply referred to as, collectively, a word line selection signal WS.

A local decoder 50 is arranged in correspondence to each word line WL. Local decoder 50 activates or inactivates a corresponding word line WL in accordance with the voltage of a corresponding word line selection signal WS and a corresponding global word line GWL. Various structures have conventionally been proposed for such a local decoder which is one kind of row decoder.

Local decoder 50 arranged at local decoder zone 20a includes, for example, an NAND gate producing the result of an NAND logical operation of the voltage level of a corresponding one of word line selection signals WSa0 to WSa3 and the voltage level of a corresponding global word line GWL, and an inverter driving the voltage of a corresponding word line WL in accordance with an output of the NAND gate.

FIG. 11 is a circuit diagram showing the first configuration example of a local decoder according to the conventional technique.

Referring to FIG. 11, local decoder 50 according to the conventional technique includes P-channel MOS transistors 51 and 52 connected in parallel between power-supply voltage Vcc and node N0, N-channel MOS transistors 53 and 54 connected in series between node N0 and ground voltage Vss, and an inverter 55 driving word line WL with one of power-supply voltage Vcc and ground voltage Vss in accordance with the inversion level of the voltage of node N0.

Each gate of transistors 52 and 53 is connected to node N1, whereas each gate of transistors 51 and 54 is connected to node N2. One of nodes N1 and N2 is connected to a corresponding global word line GWL, while the other one of nodes N1 and N2 receives a corresponding word line selection signal WS. Local decoder 50 shown in FIG. 11 is also referred to as an "NAND decoder." In local decoder 50 corresponding to a word line to be activated, both nodes N1 and N2 are set at the H level (e.g. power-supply voltage Vcc). Thus, local decoder 50 connects the word line to be activated to power-supply voltage Vcc, while connecting the word line to be inactivated to ground voltage Vss.

In the present description, the operation for raising word line WL from the L level (e.g. ground voltage Vss) to the H level (e.g. power-supply voltage Vcc) will be referred to as "activation of word line," and the operation for lowering word line WL from the H level to the L level will be referred to as "inactivation of word line." In addition, the operation for selectively activating or inactivating each word line is also referred to as "activation control of word line."

FIG. 12 is a circuit diagram showing the second configuration example of a local decoder according to the conventional technique.

Referring to FIG. 12, a local decoder 60 according to the conventional technique includes P-channel MOS transistors 61 and 62 connected in series between power-supply voltage Vcc and word line WL, and N-channel MOS transistors 63 and 64 connected in parallel between word line WL and ground voltage Vss. Each gate of transistors 61 and 63 is connected to node N1, and each gate of transistors 62 and 64 is connected to node N2. Local decoder 60 is also referred to as an "NOR decoder." In the local decoder corresponding to a word line to be activated, both nodes N1 and N2 are set at the L level (e.g. ground voltage Vss).

Compared with local decoder 50 of an NAND type shown in FIG. 11, such local decoder 60 of an NOR type can be reduced in the number of circuit elements therein, allowing reduction of the circuit area. In local decoder 60, however, word line WL must be directly driven by transistors 61 to 64, which requires these transistors to have relatively large current drivability (transistor size). This increases the gate capacitance of each transistor, which in turn increases the load capacitance of nodes N1 and N2 corresponding to an input terminal of local decoder 60, making it difficult to increase the speed of activation control of word lines.

A structure of a local decoder that can be reduced in size and increased in operation speed is further disclosed in Aizaki S., et al. "A 15 ns 4 Mb CMOS SRAM" ISSCC DIGEST OF TECHNICAL PAPERS, pp. 126–127; February 1990 (hereinafter also referred to as "Conventional Example 2").

FIG. 13 is a circuit diagram showing the structure of a local decoder according to the conventional technique described in Conventional Example 2.

Referring to FIG. 13, a local decoder 70 shown in Conventional Example 2 includes an N-channel MOS transistor 71 electrically coupled between nodes N0 and N2, P-channel MOS transistor 73 electrically coupled between power-supply voltage Vcc and node N0, and an inverter 75 for driving word line WL with one of power-supply voltage Vcc and ground voltage Vss in accordance with the inversion level of the voltage of node N0. The size (current drivability) of transistor 73 is designed to be smaller than the size (current drivability) of transistor 71.

The gate of transistor 71 is connected to node N1. The gate of transistor 73 is connected to ground voltage Vss, setting transistor 73 in a normally-on state. One of nodes N1 and N2 is connected to global word line GWL, while the other one of nodes N1 and N2 receives a corresponding word line selection signal WS.

When word line WL is inactivated, in a corresponding local decoder 70, node N1 is set at the L level (ground voltage Vss) while transistor 71 is turned off. In such a state, node N0 is charged to power-supply voltage Vcc by transistor 73 in the normally-on state, so that inverter 75 connects a corresponding word line WL to ground voltage Vss to inactivate the word line WL.

When word line WL is activated, in a corresponding local decoder 70, node N1 is set at the H level (power-supply voltage Vcc) to turn on transistor 71 and then node N2 is set at the L level (ground voltage Vss). In this state, through current represented by the arrow in the drawings, which flows from power-supply voltage Vcc via transistors 71 and 73 to node N2 set at the L level, drives node N0 toward ground voltage Vss. Accordingly, inverter 75 connects a corresponding word line WL with power-supply voltage Vcc to activate the word line WL.

Such local decoder 70 can be configured with a smaller number of circuit elements compared to local decoder 50 of an NAND type. Furthermore, the current drivability (transistor size) of transistor 71 can be smaller than the current drivability (transistor size) of each of transistors 53 and 54 connected in series in local decoder 50, for attaining approximately the same drivability for node N0. This can also reduce the load capacitance of nodes N1 and N2, resulting in faster activation control of word line WL compared to local decoder 50. As such, local decoder 70 can realize further reduction of the circuit area and faster operation, compared to local decoders 50 and 60 shown in FIGS. 11 and 12 respectively.

In local decoder 70, word line WL is inactivated by charging node N0 by normally-on transistor 73 having relatively small drivability. This makes inactivation speed, i.e. lowering speed, of word line WL slower. Such a problem has been solved by the structure of a local decoder that can lower a word line at a high speed, which is disclosed in Japanese Patent Laying-Open No. 4-143995 (hereinafter also referred to as "Conventional Example 3").

FIG. 14 is a circuit diagram showing the structure of a local decoder 80 according to the conventional technique shown in Conventional Example 3.

Referring to FIG. 14, local decoder 80 shown in Conventional Example 3 further includes a P-channel MOS transistor 85 connected in parallel with transistor 73, in addition to transistors 71, 73 and inverter 75 that are arranged as in local decoder 70 shown in FIG. 13. The gate of transistor 85 is connected to node N1 as in the gate of transistor 71. Thus, transistors 71 and 85 are complimentarily turned on and off in accordance with the level of node N1.

Local decoder 80 charges node N0 by both transistors 73 and 85 when node N1 is changed from the H level to the L level to inactivate a corresponding word line WL, so that word line WL can be inactivated at a speed higher than that in local decoder 70. Word line WL is activated at a high speed, similarly to local decoder 70.

As such, the structure of local decoders 70 and 80 disclosed in Conventional Examples 2 and 3, respectively, can be used as a local decoder in order to effectuate both a smaller local decoder and faster activation control of word lines.

A semiconductor memory device, however, requires a defect acceleration test (hereinafter also referred to as a "burn-in test") to be performed that accelerates a potential initial defect to screen a chip in order to ensure operation reliability. In the burn-in test, high-field stress is applied to a wafer, i.e. chip, that went through the manufacturing process, to elicit such a potential defect.

At the burn-in test, time required for the test per chip must be shortened. Therefore, the burn-in test employs such a structure that a plurality of word lines are activated in parallel within a semiconductor memory device in response to a specific control signal input at the test. In particular, a technique for efficiently eliciting a potential failure in a short period of time by activating all word lines in every even-numbered or odd-numbered rows.

In the local decoders shown in FIGS. 13 and 14 respectively, however, through current flows at activation, i.e. raising, of word line WL, increasing the operating current if a number of word lines are raised at the same time in the burn-in test. This is significant in a large scale semiconductor memory device. In an extreme case, the chip itself may generate heat. If the number of chips that can be mounted at once on a test board for the burn-in test needs to be limited in consideration of operating peak current efficiency of the burn-in test will be lowered.

SUMMARY OF THE INVENTION

An object of the present invention is to provide a semiconductor memory device with a simple structure that controls activation of a word line at a high speed in normal operation, and that includes a local decoder having a circuit configuration capable of suppressing operating current in a burn-in test.

According to an aspect of the present invention, a semiconductor memory device includes a plurality of memory cells, a plurality of global word lines, a plurality of word lines, a global decoder, a plurality of local decoder selection circuits, K (K: natural number) selection signal lines, a plurality of local decoders, and a control circuit.

The plurality of memory cells are arranged in rows and columns, and divided into a plurality of blocks along a column direction. Each of the plurality of global word lines are arranged at every K (K: natural number) memory cell rows, to be common to the plurality of blocks. The plurality of word lines are separately arranged for each of the memory rows in correspondence to the plurality of blocks, respectively. The global decoder sets a voltage of the plurality of global word lines in accordance with the result of row selection. The plurality of local decoder selection circuits are provided in correspondence to the plurality of blocks respectively, each generating K selection signals associated with respective ones of K word lines associated with each of the global word lines, in accordance with selection information of the plurality of blocks and the result of row selection. K selection signal lines are provided for each of the blocks, to transmit the K selection signals from a corresponding one of the plurality of local decoder selection circuits, respectively. The plurality of local decoders are provided in correspondence to the plurality of word lines respectively, each controlling activation of corresponding one of the word lines in accordance with a voltage of a corresponding one of the K selection signal lines and a voltage of a corresponding one of the plurality of global word lines. Each of the local decoders includes a first switch circuit connecting, in accordance with a voltage of a first node connected to one of the corresponding selection signal line and a corresponding one of the global word lines, a second node connected to the other one of the corresponding selection signal line and the corresponding global word line with an internal node, a driver circuit to set the corresponding word line in an activated state when the internal node is set at a first voltage via the first switch circuit, and to set the corresponding word line in an inactivated state when the internal node is set at a second voltage, and a second switch circuit to connect the internal node with the second voltage. A control circuit turns off the second switch circuit, in another operation mode different from a normal operation mode, where multiple ones of said plurality of word lines are simultaneously activated, in the local decoder corresponding to each of the simultaneously activated plurality of word lines.

Preferably, another operation mode corresponds to a burn-in test.

Therefore, a primary advantage of the present invention is to prevent through current from flowing between the second node and the second voltage in an operation mode where a plurality of word lines are simultaneously activated. As a result, for example, operating peak current can be suppressed in the operation mode corresponding to the burn-in test.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
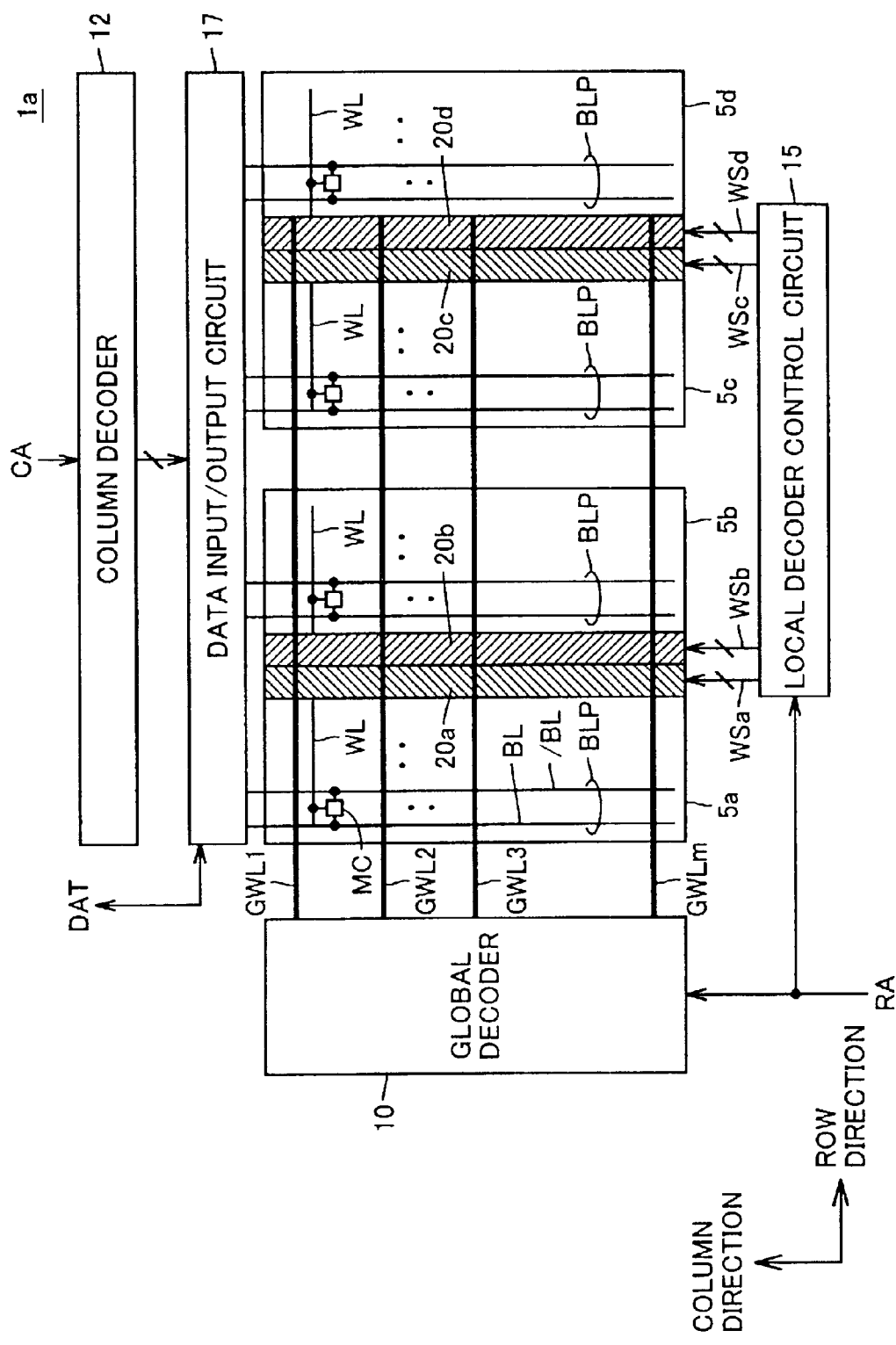
FIG. 1 is a block diagram showing the structure of a semiconductor memory device according to the first embodiment of the present invention.

Embodiments of the present invention will be described below in detail with reference to the drawings. It is noted that the same reference characters in the drawings denote the same or corresponding portions.

First Embodiment

Figure 7:
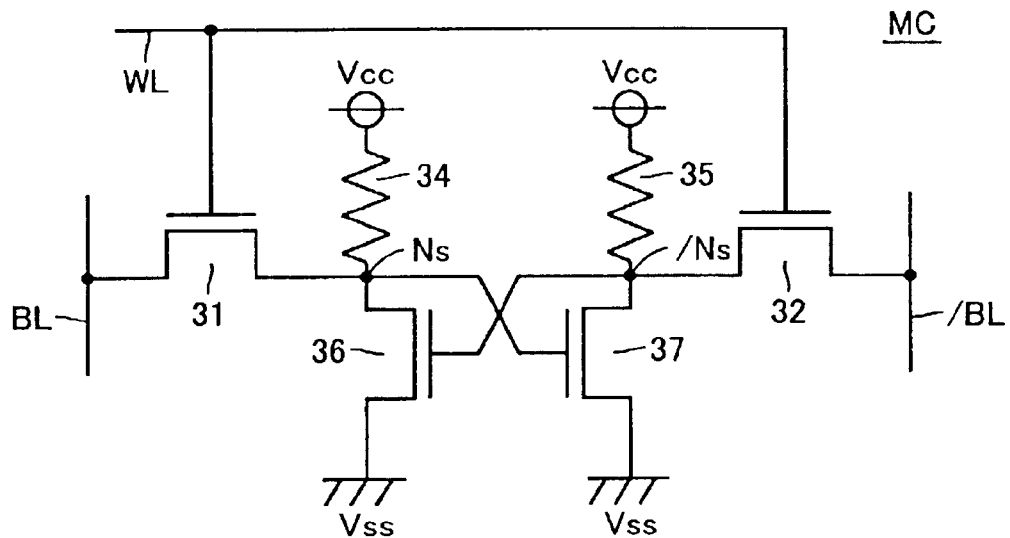
FIGS. 7 to 9 are circuit diagrams showing the first to third configuration examples of a memory cell, respectively.
Figure 8:
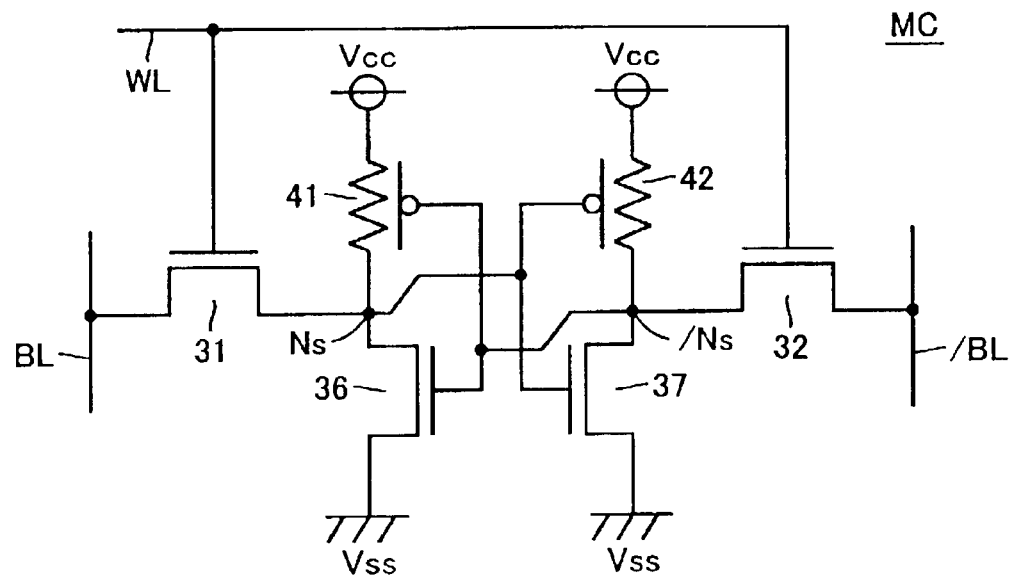
Figure 9:
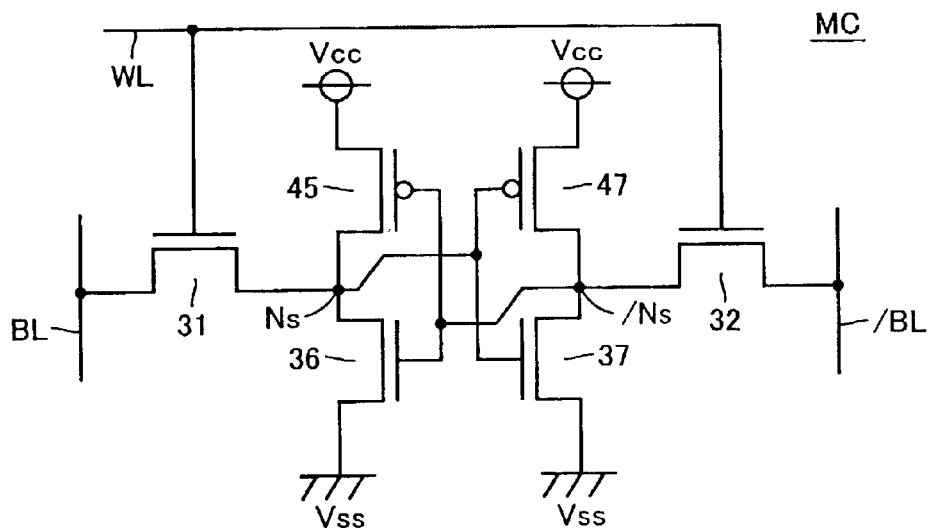

Referring to FIG. 1, a semiconductor memory device 1a according to the first embodiment includes a plurality of memory cells MC arranged in a matrix of rows and columns. The plurality of memory cells MC are divided into a plurality of memory blocks 5a to 5d along the direction of columns. For each memory cell MC, though an SRAM memory cell having the structure shown in FIGS. 7 to 9 is exemplarily arranged, the structure and type of a memory cell is not particularly limited in application of the present invention.

In each of memory blocks 5a to 5d, memory cells MC are arranged in rows and columns so as to share a memory cell row between memory blocks. In each memory block, a word line WL is arranged in correspondence to each memory cell row, whereas a bit line pair BLP constituted by bit lines BL and /BL is arranged in correspondence to each memory column. Thus, word lines WL are separately arranged, for each memory cell row, in respective memory blocks 5a to 5d. A global word line GWL is arranged common to memory blocks 5a to 5d in every K (K: natural number) memory cell rows. Thus, when m (m: natural number) global word lines GWL1 to GWLm are arranged in total, the number of memory cell rows included in each memory block is represented by (m×K).

Semiconductor memory device 1a further includes a global decoder 10 and a local decoder control circuit 15 for selecting a row in accordance with a row address RA, a column decoder 12 for selecting a column in accordance with a column address CA, local decoder zones 20a to 20d provided in correspondence to memory blocks 5a to 5d respectively, and a data input/output circuit 17. Data input/output circuit 17 reads and writes data from/into a selected memory cell via a bit line pair BLP in a selected column.

Local decoder control circuit 15 generates, in memory blocks 5a to 5d, word line selection signals WSa to WSd, respectively, for controlling selection from a set of K word lines WL associated with each global word line GWL. Each of word line selection signals WSa to WSd collectively refers to the K word line selection signals generated for the same memory block. Word line selection signals WSa to WSd are transmitted to local decoder zones 20a to 20d, respectively.

Figure 2:
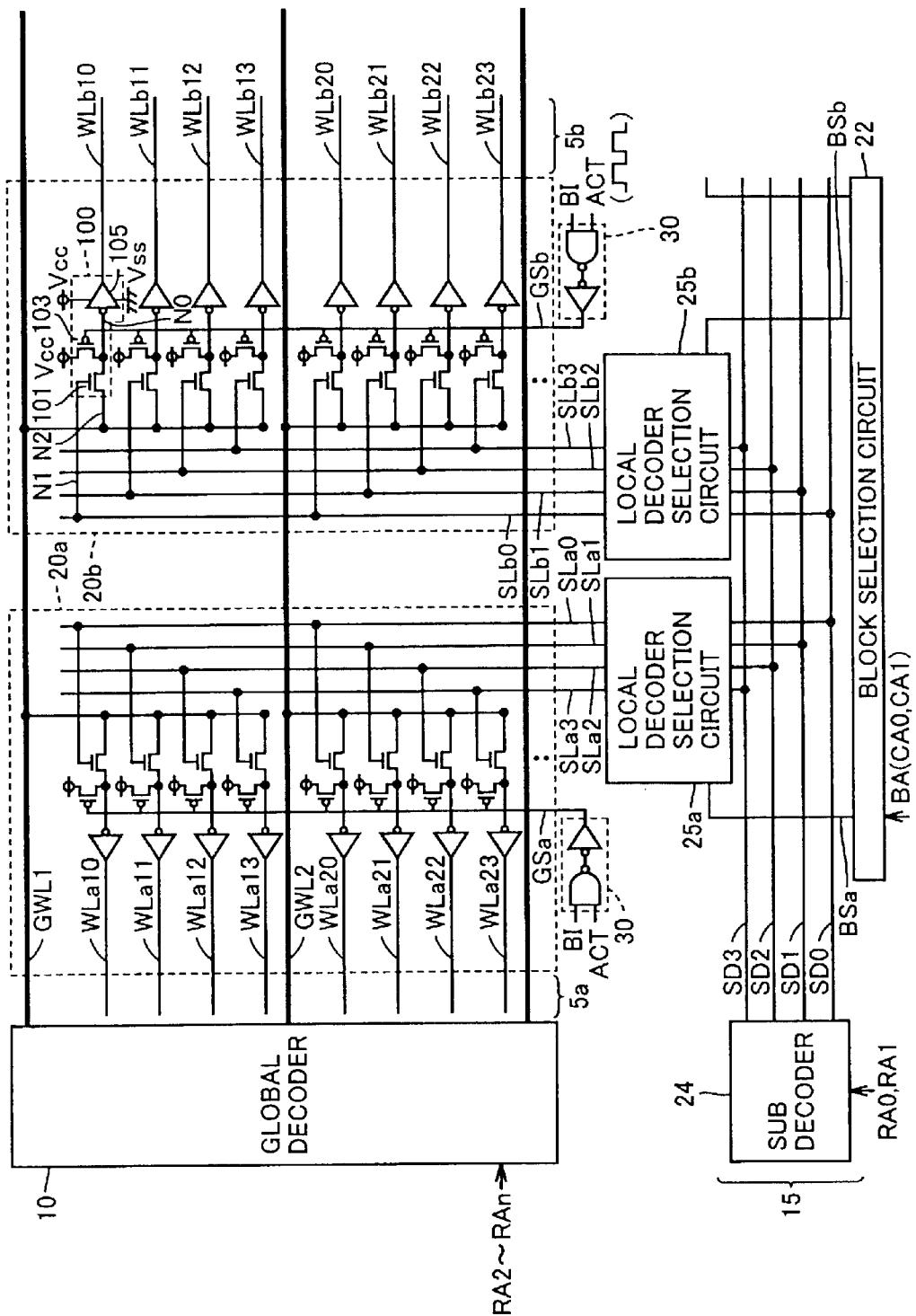
FIG. 2 is a circuit diagram showing a detailed structure with respect to activation control of word lines according to the first embodiment.

FIG. 2 shows a detailed structure according to the first embodiment with respect to activation control of word lines.

FIG. 2 illustrates a structure in which four word lines WL are arranged for one global word line GWL, i.e., K=4. In addition, FIG. 2 represents a structure related to activation control of word lines WLa10 to WLa13, WLa20 to WLa23, WLb10 to WLb13, and WLb20 to WLb23 associated with the first and second global word lines GWL1 and GWL2, in memory blocks 5a and 5b.

Local decoder control circuit 15 includes a block selection circuit 22, a sub decoder 24, local decoder selection circuits 25a to 25d associated with memory blocks 5a to 5d respectively, and a burn-in control circuit 30.

Block selection circuit 22 receives a block address BA indicating selection information of memory blocks 5a to 5d (e.g. CA0, CA1 that are the lowest 2 bits in a column address), and activates at least one of block selection signals BSa to BSd. Though FIG. 2 does not show local decoder selection circuits 25c, 25d and block selection signals BSc, BSd, since the structure corresponding to local decoders 20a and 20b are representatively shown, local decoders 20c and 20d are similarly provided with the structure corresponding to local decoders 20a and 20b, as will be described below. Moreover, in each of local decoders 20a to 20d, global word lines that are not illustrated are also provided with a structure similar to the one which will be described below.

Sub decoder 24 selectively activates sub decode signals SD0 to SD3 in response to, for example, RA0, RA1 that are the lowest 2 bits in a row address. In the normal operation mode, one of sub decode signals SD0 to SD3 is selectively activated in response to row addresses RA0, RA1.

In a burn-in test, sub decoder 24 can simultaneously activate a plurality ones of sub decode signals SD0 to SD3. For instance, a pair of sub decode signals SD0 and SD2, or a pair of subdecode signals SD1 and SD3 are simultaneously activated. This can activate word line WL per row at the burn-in test. Likewise, block selection circuit 22 can also simultaneously activate a plurality ones of block selection signals BSa to BSd at the burn-in test.

Figure 10:
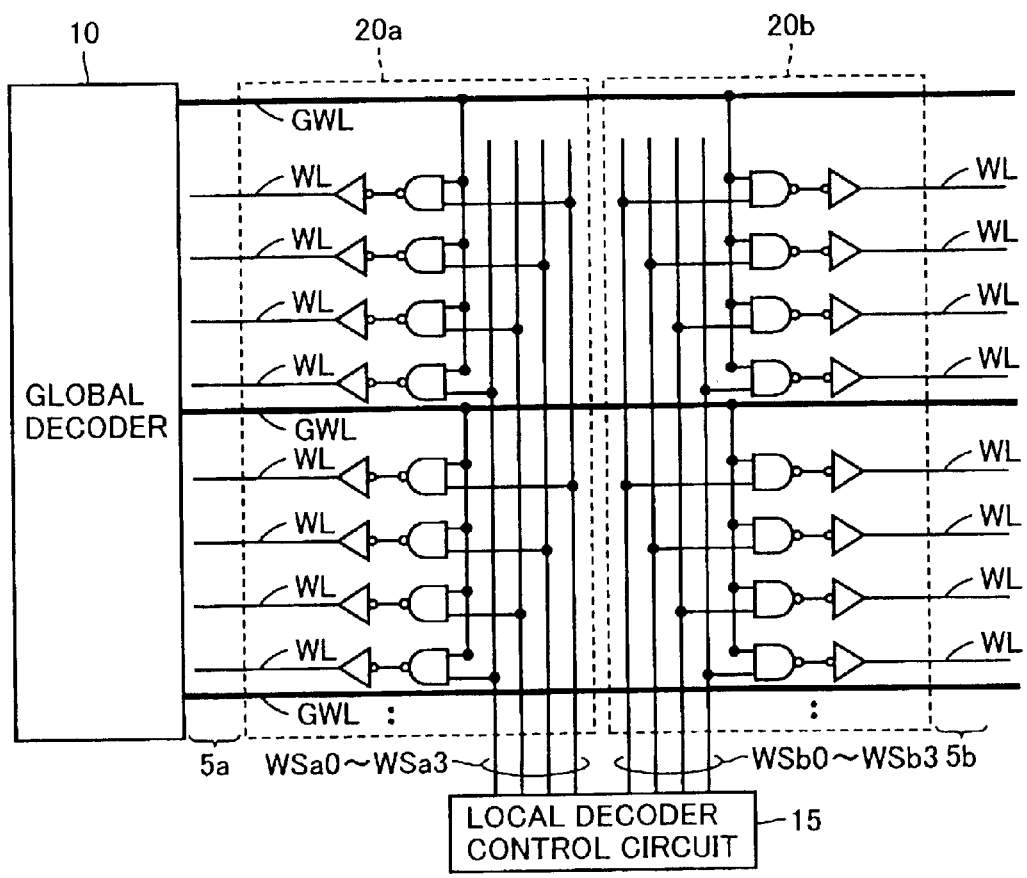
FIG. 10 is a circuit diagram illustrating the structure of a local decoder zone in the divided word line structure.
Figure 11:
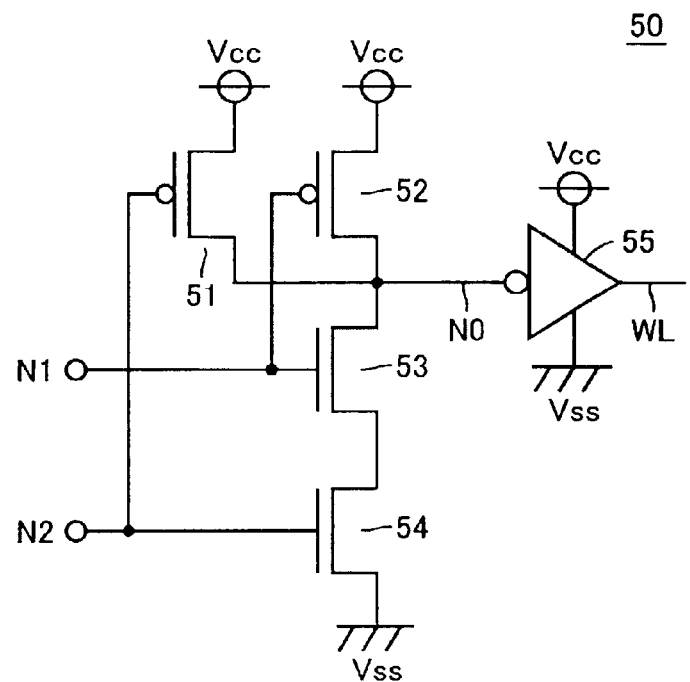
FIGS. 11 to 14 are circuit diagrams showing, respectively, the first to fourth configuration examples of a local decoder according to the conventional technique.
Figure 12:
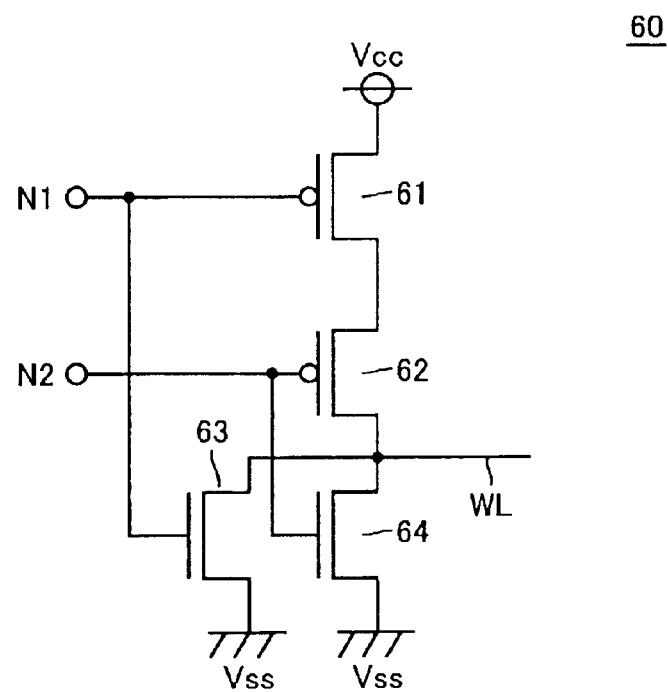

Local decoder selection circuit 25a receives block selection signal BSa and sub decode signals SD0 to SD3, to generate word line selection signals WSa0 to WSa3 that are similar to those in FIG. 10, associated with memory block 5a. When a corresponding block selection signal BSa is inactivated, local decoder selection circuit 25a inactivates word line selection signals WSa0 to WSa3 irrespective of the level of sub decode signals SD0 to SD3. When, on the other hand, a corresponding block selection signal BSa is activated, local decoder selection circuit 25a activates word line selection signals WSa0 to WSa3 in accordance with sub decode signals SD0 to SD3, respectively. For instance, word line selection signal WSa0 is activated or inactivated based on the result of logical operation of sub decode signal SD0 and block selection signal BSa. These word line selection signals WSa0 to WSa3 are transmitted by signal lines SLa0 to SLa3 arranged in local decoder zone 20a along the column direction.

Local decoder selection circuit 25b receives block selection signal BSb and sub decoder signals SD0 to SD3, to generate word line selection signals WSb0 to WSb3 that are similar to those in FIG. 10. These word line selection signals WSb0 to WSb3 are transmitted, respectively, by signal lines SLb0 to SLb3 arranged in local decoder zone 20b along the column direction. Activation and inactivation of word line selection signals WSb0 to WSb3 are set in a manner similar to word line selection signals WSa0 to WSa3, so that detailed description thereof will not be repeated. Furthermore, in the description below, signal lines SLa0 to SLa3, SLb0 to SLb3, . . . transmitting word line selection signals WSa0 to WSa3, WSb0 to WSb3, . . . respectively, are collectively referred to as, simply, a signal line SL.

Burn-in control circuit 30 is provided in correspondence to each of memory blocks 5a to 5d, to output the result of an AND operation of a burn-in signal BI and a chip activation signal ACT as gate control signals GSa to GSd. Thus, gate control signals GSa to GSd corresponding to respective memory blocks 5a to 5d are transmitted to local decoder zones 20a to 20d, respectively. In the description below, gate control signals GSa to GSd are also collectively referred to as a gate control signal GS.

Burn-in signal BI is set at the H level in the burn-in test. An external clock signal having a certain cycle is generally used as chip activation signal ACT. Thus, gate control signal GS is fixed at the L level in normal operation, whereas it periodically repeats H level and L level periods, i.e., has both the H and L level periods at the burn-in test.

Moreover, in the structure in which burn-in control circuit 30 is provided in each memory block, selection information of memory blocks 5a to 5d may be reflected in burn-in signal BI or chip activation signal ACT. Alternatively, burn-in control circuit 30 may be provided in common to memory blocks 5a to 5d, to share gate control signal GS by the memory blocks.

Global decoder 10 controls activation of each global word line GWL by setting the voltage thereof at the H or L level in accordance with the remaining bits RA2 to RAn (n: an integer equal to or higher than 3) in a row address, i.e., the result of row selection. In the normal operation, global decoder 10 selectively activates one of global word lines GWL1 to GWL, in accordance with row addresses RA2 to RAn. In the burn-in test, global decoder 10 can simultaneously activate a plurality ones of global word lines GWL1 to GWLm.

A local decoder 100 is arranged in correspondence to each word line WL in each of local decoder zones 20a to 20d. Local decoder 100 activates or inactivates a corresponding word line WL in accordance with the voltage level of nodes N1 and N2 corresponding to an input terminal, i.e., controls the activation of the corresponding word line WL. One of nodes N1 and N2 is connected to one of a corresponding signal line SL and a corresponding global word line GWL. For instance, in a local decoder associated with word line WLb10, node N1 is connected to signal line SLb0, and node N2 is connected to global word line GWL1.

Figure 13:
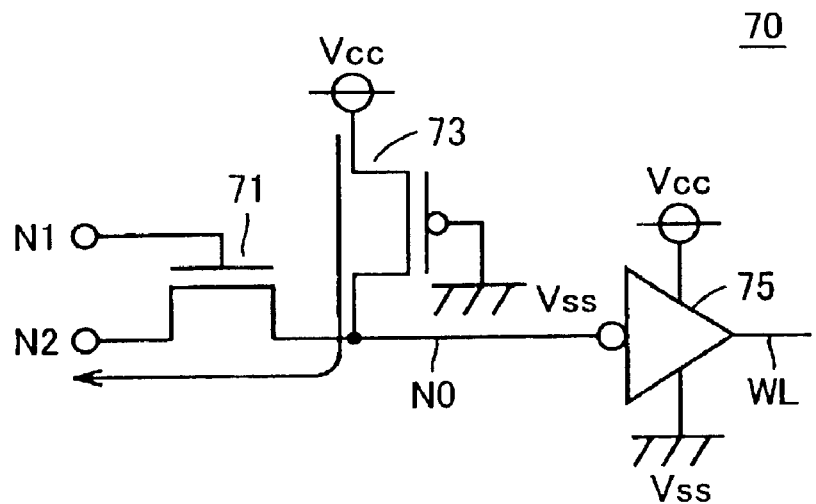

Local decoder 100 has a structure similar to that of local decoder 70 shown in FIG. 13, and includes an N-channel MOS transistor 101 electrically coupled between nodes N0 and N2, a P-channel MOS transistor 103 electrically coupled between power-supply voltage Vcc and node N0, and an inverter 105 operating as a driver circuit for driving a corresponding word line WL with one of power-supply voltage Vcc and ground voltage Vss in accordance with the voltage of node N0. The gate of transistor 101 is connected to node N1. It is noted that the voltage level of power-supply voltage Vcc is raised in the burn-in test, compared to that in the normal operation, due to application of high-field stress. Furthermore, the MOS transistor shown in the present embodiment is a representative of a field effect transistor.

Inverter 105 activates a corresponding word line WL by driving the word line WL with power-supply voltage Vcc, when node N0 is set at the L level (ground voltage Vss). When, on the other hand, node N0 is set at the H level (power-supply voltage Vcc), inverter 105 inactivates a corresponding word line WL by driving the word line WL with ground voltage Vss. Transistors 101, 103 and inverter 105 correspond to transistors 71, 73 and inverter 75, respectively, in local decoder 70 shown in FIG. 13. A gate control signal GS is input into the gate of transistor 103 from a corresponding burn-in control circuit 30.

When word line WL is activated, a corresponding global word line GWL is activated to the L level, while the voltage of a corresponding signal line SL (i.e. word line selection signal WS) is set at the H level. This turns on transistor 101, setting node N0 at ground voltage Vss. Accordingly, inverter 105 activates a corresponding word line WL by driving the word line WL with power-supply voltage Vcc.

On the contrary, when a corresponding word line is inactivated, i.e. lowered, a corresponding sub decode signal is inactivated to the L level, turning off transistor 101. Thus, transistor 103 charges node N0 with power-supply voltage Vcc, so that inverter 105 connects the corresponding word line with ground voltage Vss to inactivate the word line. Alternatively, a corresponding global word line GWL may be inactivated to the H level while transistor 101 is kept on.

In the burn-in test, activation control of word lines is executed with timing synchronized with chip activation signal ACT. Specifically, word line WL is selectively activated during the H level period of chip activation signal ACT, i.e. the H level period of gate control signal GS. Owing to such a structure, when a corresponding word line WL is activated in the burn-in test, transistor 103 within each local decoder 100 corresponding to the activated word line is turned off, generating no through current flowing from power-supply voltage Vcc to node N2 that is set at the L level (ground voltage Vss). This prevents increase of operating peak current in the semiconductor memory device, even if a number of word lines WL are simultaneously activated in parallel in the burn-in test.

As a result, even if a number of word lines are simultaneously selected, i.e. activated, in order to shorten the time required for the burn-in test, the number of chips that can be simultaneously mounted on a test board for the burn-in test can be increased, allowing the burn-in test to be efficiently performed. This results in reduction of cost for the test.

Transistor 103 may be turned on at each local decoder 100 during the L level period of chip activation signal ACT in the burn-in test, i.e. the L level period of gate control signal GS, which may cause through current to flow toward node N2. In practice, however, such through current will not flow, since the chip is inactivated when chip activation signal ACT is set at the L level, inactivating e.g. local decoder control circuit 15 and thus turning off transistor 101.

As was described above, in the normal operation, gate control signal GS applied to each local decoder is set at the L level, local decoder 100 can activate (raise) and inactivate (lower) a corresponding word line WL at a high speed, as in the case with local decoder 70 shown in FIG. 13.

Second Embodiment

Figure 3:
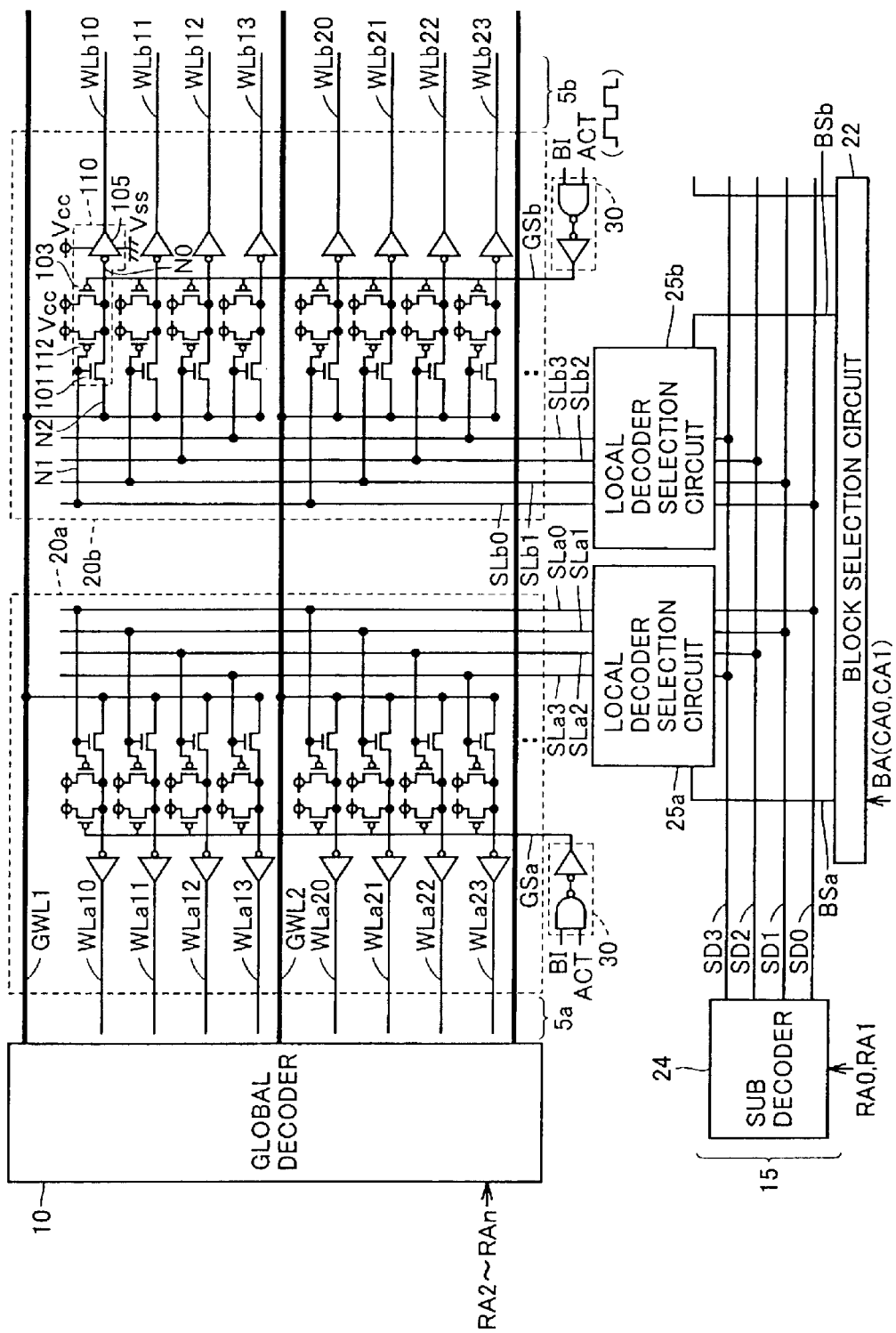
FIG. 3 is a circuit diagram showing a detailed structure with respect to activation control of word lines according to the second embodiment.

FIG. 3 is a circuit diagram showing a detailed structure according to the second embodiment with respect to activation control of word lines.

Referring to FIG. 3, in the structure according to the second embodiment, a local decoder 110 is arranged in place of local decoder 100, in correspondence to each word line. Local decoder 110 includes, in addition to the structure of local decoder 100 shown in FIG. 2, a P-channel MOS transistor 112 electrically coupled between power-supply voltage Vcc and node N0. The gate of transistor 112 is connected to node N1 as in the case with the gate of transistor 101.

Figure 14:
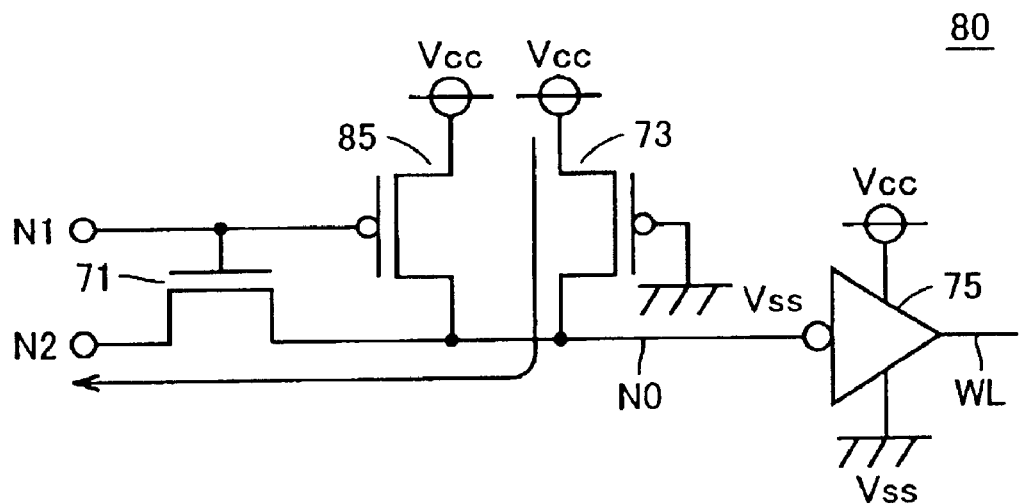

Transistor 112 corresponds to transistor 85 at local decoder 80 shown in FIG. 14. Thus, in the normal operation mode where gate control signal GS is fixed at the L level, local decoder 110 operates in a manner similar to local decoder 80 shown in FIG. 14, and can inactivate (lower) a corresponding word line WL at a speed higher than that for local decoder 100 shown in FIG. 2.

When word line WL is activated in the burn-in test, the voltage of gate control signal GS and N1 are set at the H level, turning off transistors 103 and 112. Thus, as in the structure according to the first embodiment, even if a number of word lines are simultaneously selected, i.e. activated, operating peak current in the semiconductor memory device will not increase. Therefore, as in the case with the first embodiment, the burn-in test can be performed with higher efficiency. The structure and operation of the other parts according to the second embodiment are similar to those in the first embodiment shown in FIG. 2, so that detailed description thereof will not be repeated.

Note that, though the first and second embodiments show the structure in which input nodes N1 and N2 of local decoders 100 and 110 are connected to corresponding signal line SL and global word line GWL respectively, the connection therebetween can be switched. That is, node N1 may be connected to global word line GWL, whereas node N2 may be connected to a corresponding signal line SL. In such a case, when word line WL is activated, the voltage of a corresponding signal line SL (corresponding word line selection signal WS) must be set at the L level and a corresponding global word line must be set at the H level. In addition, when word line WL is inactivated, the voltage of a corresponding signal line SL may be set at the H level while a corresponding global word line GWL is set at the H level, or a corresponding global word line GWL is set at the L level. Such connection between input nodes N1 and N2 may arbitrarily be determined in consideration of signal propagation speed and the like at each of global word line GWL and signal line SL.

Figure 4:
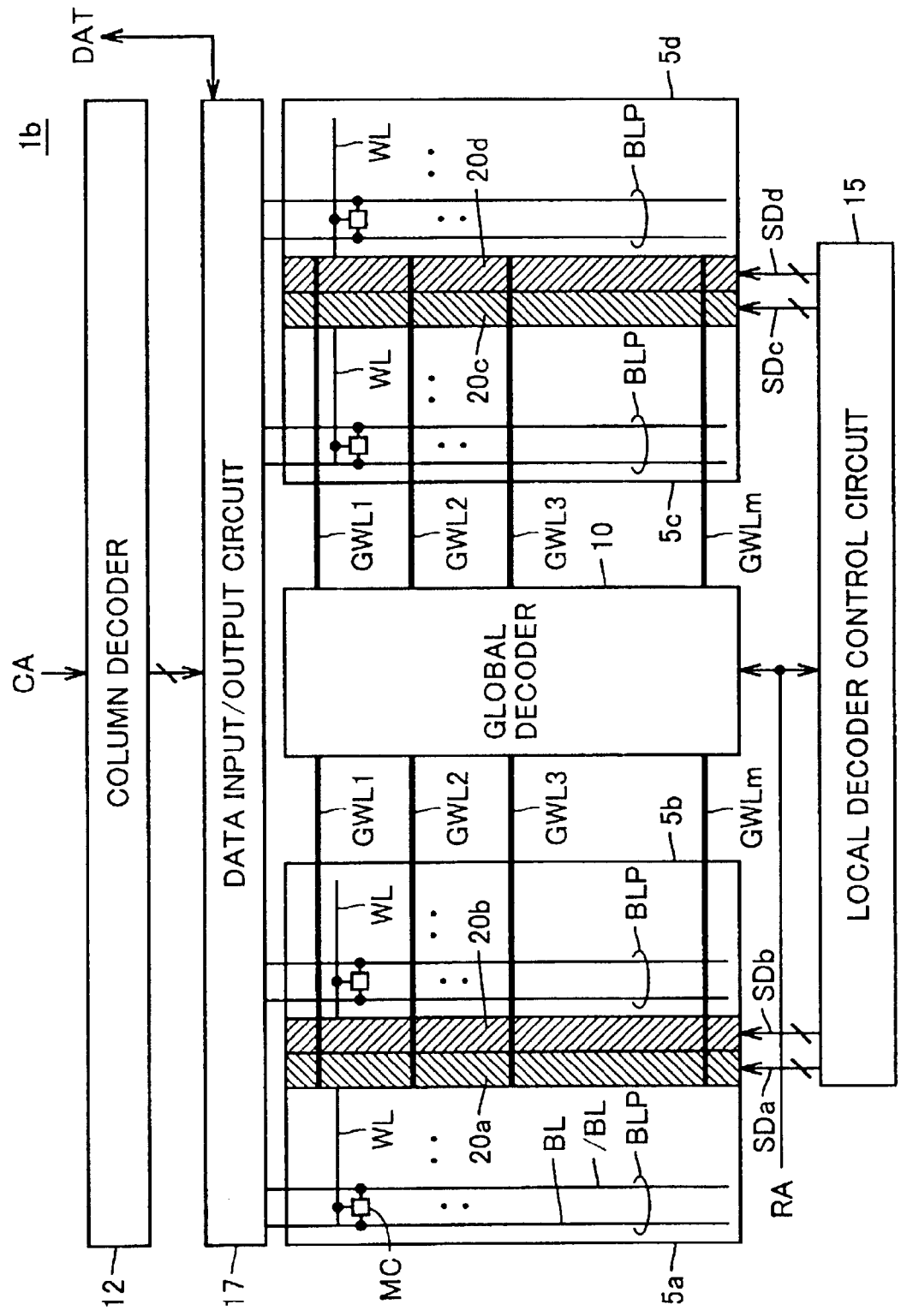
FIG. 4 is a block diagram showing a different arrangement example of a global decoder in a semiconductor memory device according to an embodiment of the present invention.
Figure 5:
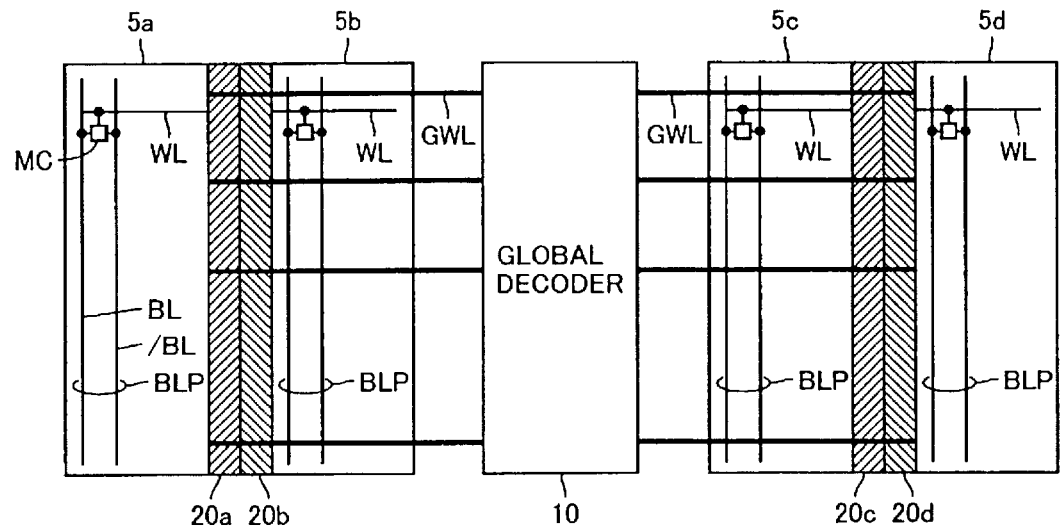
FIGS. 5 and 6 are the first and second conceptual diagrams illustrating a divided word line structure.
Figure 6:
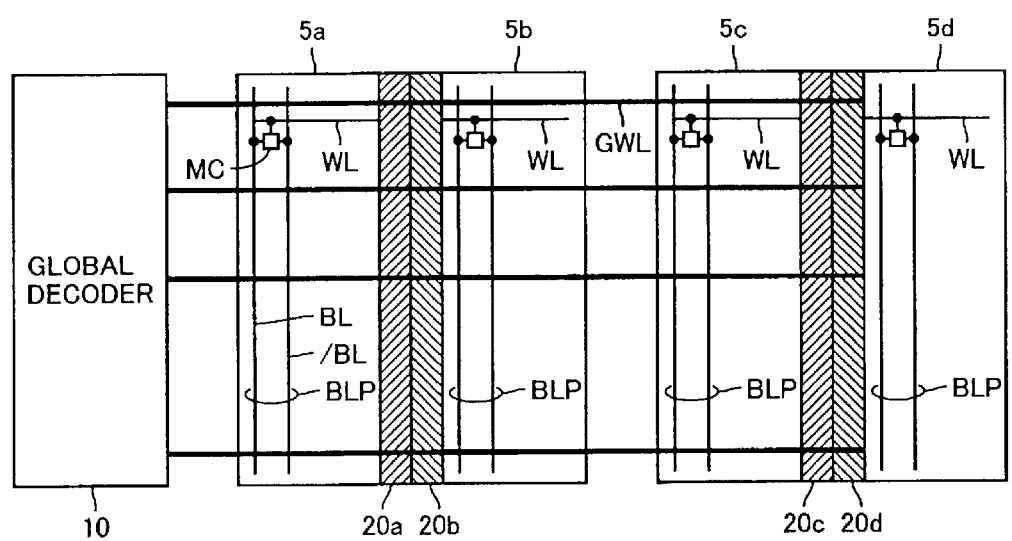

Moreover, as shown in FIG. 4, global decoder 10 may also be arranged at a middle portion of the memory array as in the structure shown in FIG. 6. Such a structure with local decoder control circuit 15 and local decoder zones 20a to 20d according to the first or second embodiment enables both faster activation control of word lines in normal operation and suppressed operating peak current in a burn-in test.

Furthermore, though the first and second embodiments show the memory array divided into four memory blocks 5a to 5d, the number of divided memory blocks may arbitrarily be set. Likewise, in each memory block, K indicating the number of word line WL associated with one global word line GWL may also arbitrarily be set. For instance, the ratio global word line GWL and word line WL may be 1:1 (K=1). In such an instance, word line selection signals WSa to WSd are generated only based on the selection information of memory blocks 5a to 5d.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory cells arranged in rows and columns, and divided into a plurality of blocks long a column direction;
   a plurality of global word lines each arranged in common to said plurality of blocks, at every K (K: natural number) memory cell rows;
   a plurality of word lines separately arranged for each of said memory rows, in correspondence to said plurality of blocks respectively;
   a global decoder setting a voltage of said plurality of global word lines in accordance with a result of row selection;
   a plurality of local decoder selection circuits provided in correspondence to said plurality of blocks respectively, each generating K selection signals associated with respective K word lines associated with each of said global word lines, in accordance with selection information of said plurality of blocks and said result of row selection;
   K selection signal lines provided for each of said blocks, to transmit, respectively, said K selection signals from a corresponding one of said plurality of local decoder selection circuits;
   a plurality of local decoders provided in correspondence to said plurality of word lines respectively, each controlling activation of a corresponding one of said word lines in accordance with a voltage of a corresponding one of said K selection signal lines and a voltage of a corresponding one of said plurality of global word lines,
   each of said local decoders including
      a first switch circuit connecting, in accordance with a voltage of a first node connected to one of the corresponding selection signal line and a corresponding one of said global word lines, a second node connected to the other one of the corresponding selection signal line and the corresponding global word line with an internal node,
      a driver circuit to set said corresponding word line in an activated state when said internal node is set at a first voltage via said first switch circuit, and to set said corresponding word line in an inactivated state when said internal node is set at a second voltage, and
      a second switch circuit to connect said internal node with said second voltage; and
   a control circuit to turn off said second switch circuit, in another operation mode different from a normal operation mode, where multiple ones of said plurality of word lines are simultaneously activated, in said local decoder corresponding to each of the simultaneously-activated plurality of word lines.

2. The semiconductor memory device according to claim 1, wherein
   said another operation mode corresponds to a burn-in test.

3. The semiconductor memory device according to claim 1, wherein
   said driver circuit includes an inverter element having said internal node as an input node and the corresponding word line as an output node,
   said first switch circuit includes a first field effect transistor electrically coupled between said second node and said internal node and having a gate connected to said first node, and
   said second switch circuit includes a second field effect transistor electrically coupled between said second voltage and said internal node, and having a gate receiving an output signal from said control circuit.

4. The semiconductor memory device according to claim 1, wherein
   each of said local decoder further includes a third switch circuit provided between said internal node and said second voltage, to complimentarily turn on said first switch circuit.

5. The semiconductor memory device according to claim 4, wherein
   said driver circuit includes an inverter element having said internal node as an input node and the corresponding word line as an output node,
   said first switch circuit includes a first field effect transistor electrically coupled between said second node and said internal node, and having a gate connected to said first node, said second switch circuit includes a second field effect transistor electrically coupled between said second voltage and said internal node, and having a gate receiving an output signal of said control circuit, said third switch circuit includes a third field effect transistor electrically coupled between said internal node and said second voltage, and having a gate connected to said first node, and said third field effect transistor has a conductivity type opposite to a conductivity type of said first field effect transistor.

6. The semiconductor memory device according to claim 1, wherein said control circuit turns off said second switch circuit of each of said local decoders in parallel, when multiple ones of said plurality of word lines are simultaneously activated, in said another operation mode.

7. The semiconductor memory device according to claim 1, wherein said control circuit is provided in correspondence to each of said blocks, and said control circuit turns off said second switch circuit in each of said local decoders in a corresponding one of said blocks in parallel, when the word line in the corresponding block is activated, in said another operation mode.

* * * * *